(12) United States Patent
Lee et al.

(10) Patent No.: US 8,729,670 B2
(45) Date of Patent: May 20, 2014

(54) SEMICONDUCTOR SUBSTRATE AND METHOD FOR MANUFACTURING THE SAME

(75) Inventors: Hae Yong Lee, Yongin-Si (KR); Young Jun Choi, Seoul (KR); Jung Gyu Kim, Busan (KR)

(73) Assignee: Lumigntech Co., Ltd. (KR)

( * ) Notice: Subject to any disclaimer, the term of this patent is extended or adjusted under 35 U.S.C. 154(b) by 471 days.

(21) Appl. No.: 12/935,978

(22) PCT Filed: Apr. 15, 2009

(86) PCT No.: PCT/KR2009/001932
§ 371 (c)(1),
(2), (4) Date: Oct. 1, 2010

(87) PCT Pub. No.: WO2009/128646
PCT Pub. Date: Oct. 22, 2009

(65) Prior Publication Data
US 2011/0024878 A1    Feb. 3, 2011

(30) Foreign Application Priority Data

Apr. 16, 2008  (KR) .................. 10-2008-0035114
Oct. 24, 2008  (KR) .................. 10-2008-0104550

(51) Int. Cl.
*H01L 21/20* (2006.01)
*H01L 29/20* (2006.01)

(52) U.S. Cl.
USPC .................................. 257/615; 257/E29.068

(58) Field of Classification Search
USPC ......................................... 257/615, E29.068
See application file for complete search history.

(56) References Cited

U.S. PATENT DOCUMENTS

| | | | |
|---|---|---|---|
| 6,958,254 B2 * | 10/2005 | Seifert | ............................ 438/47 |
| 2005/0077512 A1 | 4/2005 | Yoon et al. | |
| 2006/0118803 A1* | 6/2006 | Lee et al. | ........................ 257/98 |
| 2007/0141823 A1* | 6/2007 | Preble et al. | .................. 438/604 |
| 2008/0054296 A1 | 3/2008 | Yoon et al. | |

FOREIGN PATENT DOCUMENTS

| KR | 10-2005-0035565 | 4/2005 |
|---|---|---|
| KR | 10-2006-0064306 | 6/2006 |

OTHER PUBLICATIONS

Jie Cui, et al. "Dynamic Behavior of Group III and V Organometallic Sources and Nanostructure Fabrication by Supersonic Molecular Beams", Journal of Crystal Growth, 2000, pp. 492-498, vol. 209.
T. Mano, et al. "Fabricaration of InGaAs Quantum Dots on GaAs(001) by Droplet Epitaxy", Journal of Crystal Growth, 2000, pp. 504-508, vol. 209.
International Search Report—PCT/KR2009/001932 dated Nov. 18, 2009.
Written Opinion—PCT/KR2009/001932 dated Nov. 18, 2009.

* cited by examiner

*Primary Examiner* — Colleen Matthews
*Assistant Examiner* — Vernon P Webb
(74) *Attorney, Agent, or Firm* — Cantor Colburn LLP

(57) ABSTRACT

Provided is a semiconductor substrate and a method for manufacturing the same. The semiconductor substrate includes a substrate, a discontinuously formed hemispheric metal layer on the substrate, and a semiconductor layer on the hemispheric metal layer. A plurality of voids on the interface of the substrate and discontinuous hemisphere are formed to absorb or relax the stain of interface. Accordingly, even if a subsequent layer is relatively thickly formed on the substrate, substrate bow or warpage can be minimized.

16 Claims, 11 Drawing Sheets

(a)          (b)

(a)          (b)

(a)          (b)

SEMICONDUCTOR SUBSTRATE AND METHOD FOR MANUFACTURING THE SAME

TECHNICAL FIELD

The present disclosure relates to a semiconductor substrate, and more particularly, to a semiconductor substrate having a hemispheric layer, which is capable of minimizing substrate bow or warpage by absorbing strain of interface, and a method for manufacturing the same.

BACKGROUND ART

A semiconductor device is one of electronic components that realize electronic devices (such as a power device, a light emitting device, a light receiving device, and so forth) on a predetermined substrate through semiconductor process techniques. For example, in the power device, a transistor, a Metal-Oxide Semiconductor Field Effect Transistor (MOSFET), an Insulated Gate Bipolar Transistor (IGBT), or the Schottky diode is realized on a substrate. In the light receiving device, a photovoltaic cell or a photo sensor is realized on a substrate.

Especially, because of excellent physical and chemical characteristics, a III-V nitride semiconductor such as GaN receives great attention as a core material of a light emitting device such as a light emitting diode (LED) or a laser diode (LD). The LED or LD using the III-V nitride semiconductor is mainly used for a light emitting device in order to provide light in a blue or green wavelength range. The light emitting device is now applied to light sources of various products such as a scoreboard, and a lighting device. The III-V nitride semiconductor is typically formed of GaN-based material having an empirical formula of $In_XAl_YGa_{1-X-Y}N$ ($0<X$, $X+Y<1$).

FIG. 1 is a cross-sectional view of a typical nitride light emitting device.

Referring to FIG. 1, the nitride light emitting device includes a GaN buffer layer 110, an n-type clad layer 120, an active layer 130 having a single quantum well (SQW) structure of InGaN or a multi-quantum well (MQW) structure of InGaN, and p-type clad layer 140, which are sequentially stacked on a sapphire substrate 100 (i.e., light transmitting substrate). At this point, a portion of the p-type clad layer 140 and the active layer 130 is removed through mesa etching, such that the top portion of the n-type clad layer 120 is partially exposed. Additionally, an n-type electrode 170 is formed on the exposed top portion of the n-type clad layer 120, and a transparent conductive layer 150 formed of ITO and a p-type electrode 160 are sequentially stacked on the p-type clad layer 140. Additionally, the GaN buffer layer 110 is generally formed with a thickness of several nm.

However, disadvantages such as stress and crystal defect caused by a difference of crystal lattice in each layer cannot be resolved in a typical heterogeneous substrate. Due to this, an electronic device (esp. a light emitting device)'s characteristics such as ElectroStatic Discharge (ESD), breakdown voltage, leakage current are deteriorated, which results in a decrease in the reliability of product yield and life time.

Additionally, when a nitride semiconductor device typically includes a nitride semi-conductor layer having a thickness of 5 μm or more on a heterogeneous substrate, substrate bow or warpage occurs severely. This makes it difficult to perform subsequent manufacturing processes such as substrate alignment, a photolithography process, and an etching process.

DISCLOSURE OF INVENTION

Technical Problem

The present disclosure provides a semiconductor substrate capable of preventing substrate bow or warpage and a method for manufacturing the same. In relation to the semiconductor substrate, after a discontinuous hemispheric metal layer is formed on a substrate, the planarization of semiconductor layer is occurred by the deposition of semiconductor layer. Therefore, a plurality of voids is formed at the interface between the substrate and the semiconductor layer and a metal concentration gradient is formed on the semiconductor layer.

The present disclosure also provides a semiconductor substrate capable of preventing substrate bow or warpage and a method for manufacturing the same. In relation to the semiconductor substrate, after a discontinuous hemispheric metal layer is formed on a substrate and thermally treated, a nitride semiconductor layer is formed thereon for surface planarization. Therefore, a plurality of voids is formed at the interface between the substrate and the nitride semiconductor layer.

The present disclosure also provides a semiconductor substrate and a method for manufacturing the same. In the semiconductor substrate, even if a device layer is relatively thickly formed while being applied to a subsequent manufacturing process for semiconductor device, substrate bow or warpage occurs less. Therefore, subsequent manufacturing processes for semiconductor device become easier and a product failure rate can be minimized.

Technical Solution

In accordance with an exemplary embodiment, a semiconductor substrate includes: a substrate; a hemispheric metal layer formed on the substrate discontinuously; and a semiconductor layer formed on the hemispheric metal layer.

The hemispheric metal layer may include Group III metal and the semiconductor layer may include nitride of the Group III metal.

The Group III metal may include at least one of Ga and In.

The semiconductor layer may include the plurality of voids formed at the interface between the substrate and the semiconductor layer.

The semiconductor layer may have a concentration gradient in which the density of the metal is decreased in a thickness direction.

In accordance with another exemplary embodiment, a semiconductor substrate includes: a substrate; a hemispheric metal layer formed on the substrate discontinuously; and a semiconductor layer formed on the hemispheric metal layer, wherein the semiconductor layer has a concentration gradient in which metal density is decreased by the hemispheric metal layer in a thickness direction of the semiconductor layer; and the substrate has a final bow or warpage of less than 70 μm when the substrate has the size of 2 inches and the thickness of 430 μm and a total thickness of the hemispheric metal layer and the semiconductor layer is between 5 μm and 100 μm.

The hemispheric metal layer may include Group III metal and the semiconductor layer includes nitride of the Group III metal.

The Group III metal may include at least one of Ga and In.

The semiconductor layer may include a plurality of voids formed at an interface between the substrate and the semiconductor layer.

In accordance with another exemplary embodiment, a method for manufacturing a semiconductor substrate including: preparing a substrate; forming a discontinuous hemispheric metal layer on the substrate; and forming a semiconductor layer on an entire structure including the hemispheric metal layer.

The hemispheric metal layer may include Group III metal and the semiconductor layer includes nitride of the Group III metal.

The Group III metal may include at least one of Ga and In.

The forming of the hemispheric metal layer may be performed at a temperature of higher than a melting point of metal or lower than 450° C.

The forming of the hemispheric metal layer and the forming of the semiconductor layer may be repeatedly performed at least once.

The method, after at least one of the preparing of the substrate, the forming of the hemispheric metal layer, and the forming of the semiconductor layer, may further include at least one of: cleaning the surface of the substrate; and treating the surface of the substrate.

The forming of the hemispheric metal layer and the forming of the semiconductor layer may be performed in different chambers.

The forming of the hemispheric metal layer and the forming of the semiconductor layer may be performed in the same chamber.

The semiconductor layer may include a plurality of voids formed at an interface between the substrate and the semiconductor layer.

The semiconductor layer may have a concentration gradient in which density of the metal is decreased in a thickness direction of the semiconductor layer.

In accordance with another exemplary embodiment, a semiconductor substrate includes: a substrate; a hemispheric layer formed on the substrate discontinuously; and a nitride semiconductor layer formed on the hemispheric layer, wherein the hemispheric layer has a distribution of metal elements diffused from the substrate during a thermal treatment process.

The substrate may include at least Al element, the Al element being diffused into the hemisphere layer.

The hemispheric layer may have a concentration of Al element that is decreased as it goes far from an interface between the hemispheric layer and the substrate.

The hemispheric layer may be formed of at least one metal selected from Ga, Al, and In.

The hemispheric layer may be nitrided and the surface of the nitride semiconductor on the hemispheric layer may be planarized by the nitride semiconductor layer.

The nitride semiconductor layer may include a plurality of voids at an interface between the substrate and the nitride semiconductor layer.

In accordance with another exemplary embodiment, a semiconductor substrate includes: a substrate: a hemispheric layer formed on the substrate discontinuously; and a nitride semiconductor layer formed on the hemispheric layer, wherein the hemispheric layer has a distribution of metal element diffused from the substrate during a thermal treatment process; and the metal elements have a concentration that is decreased as it goes far from the interface between the substrate and the hemispheric layer.

The metal element may include Al element.

The nitride semiconductor layer may include a plurality of voids formed at an interface between the substrate and the nitride semiconductor layer.

The hemispheric layer may be nitrided and the surface of the nitride semiconductor on the hemispheric layer may be planarized by the nitride semiconductor layer.

In accordance with another exemplary embodiment, a method for manufacturing a semiconductor substrate includes: preparing a substrate; forming a hemispheric layer on the substrate discontinuously; performing a thermal treatment process such that a metal element in the substrate is diffused into the hemispheric layer; and forming a nitride semiconductor layer on the hemispheric layer.

The metal element may include Al element.

The hemispheric layer may be formed of at least one metal selected from Ga, Al, and In.

The forming of the hemispheric metal layer may be performed at a temperature of higher than a melting point of metal used or a temperature of lower than 450° C.

The nitride semiconductor layer may be formed with more than a thickness that allows the surface of the nitride semiconductor on the hemispheric layer to be completely planarized.

The forming of the hemispheric layer and the forming of the nitride semiconductor layer may be repeatedly performed at least once.

The nitride semiconductor layer may include a plurality of voids at the interface between the substrate and the nitride semiconductor layer.

Advantageous Effects

According to the present invention, after a discontinuous hemispheric metal layer is formed on a substrate, a semiconductor layer is formed thereon for planarization. Therefore, a plurality of voids is formed at an interface between the substrate and the semiconductor layer, and a vertical metal concentration gradient is formed in the semi-conductor layer. Additionally, the hemispheric metal layer remains at the interface therebetween. Accordingly, the voids in the semiconductor layer, the vertical metal concentration gradient of the semiconductor layer, and the remaining hemispheric metal layer are used for absorbing or relax the stain of interface. Thus, the substrate bow or warpage can be minimized.

Additionally, according to the present invention, after a discontinuous hemispheric layer is formed on a substrate and is thermally treated, a nitride semiconductor layer is formed thereon for planarizing the surface of the nitride semiconductor on the hemispheric layer. As a result, a plurality of voids are formed at the interface between the substrate and the nitride semiconductor layer, and a discontinuous hemispheric layer including an element diffused from the substrate remains at the interface of the substrate. Accordingly, the voids and the remaining discontinuous hemispheric layer are used for absorbing or relaxing the strain of interface. Therefore, substrate bow or warpage can be minimized.

Furthermore, according to the present invention, even if a device layer is relatively thickly formed during a manufacturing process for the subsequent device, substrate bow or warpage occurs less. Therefore, substrate handling such as substrate chucking and substrate alignment becomes easier. Thus, the subsequent manufacturing processes such as a photolithography process and an etching process for the device can be performed without difficulties, and also a product failure rate can be minimized.

BRIEF DESCRIPTION OF DRAWINGS

Exemplary embodiments can be understood in more detail from the following description taken in conjunction with the accompanying drawings, in which.

BEST MODE FOR CARRYING OUT THE INVENTION

Figure 1:
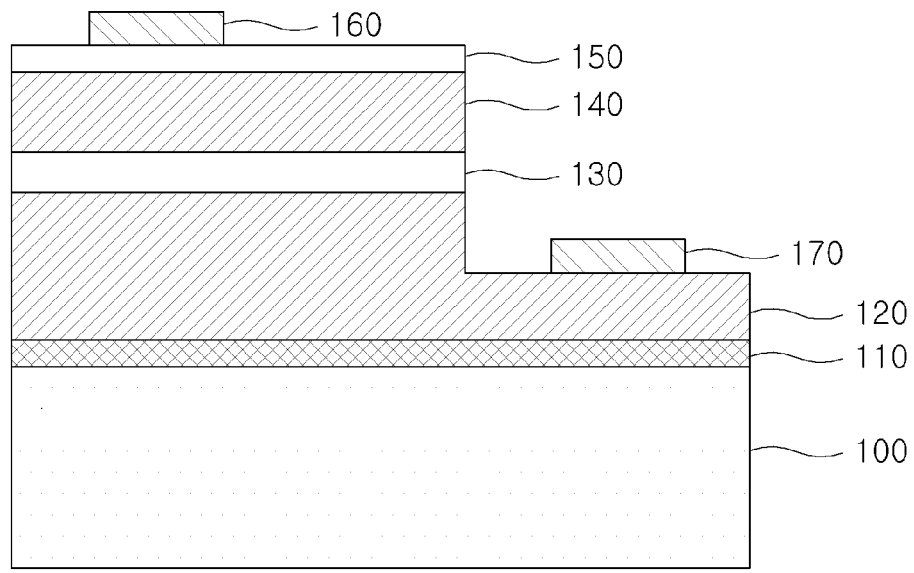
FIG. 1 is a cross-sectional view of a typical nitride light emitting device.

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

In the figures, the dimensions of layers and regions are exaggerated for clarity of illustration. Like reference numerals refer to like elements throughout. It will also be understood that when a layer, a film, a region or a plate is referred to as being 'on' another one, it can be directly on the other one, or one or more intervening layers, films, regions or plates may also be present. Further, it will be understood that when a layer, a film, a region or a plate is referred to as being 'under' another one, it can be directly under the other one, and one or more intervening layers, films, regions or plates may also be present. In addition, it will also be understood that when a layer, a film, a region or a plate is referred to as being 'between' two layers, films, regions or plates, it can be the only layer, film, region or plate between the two layers, films, regions or plates, or one or more intervening layers, films, regions or plates may also be present.

Embodiment 1

Figure 2:
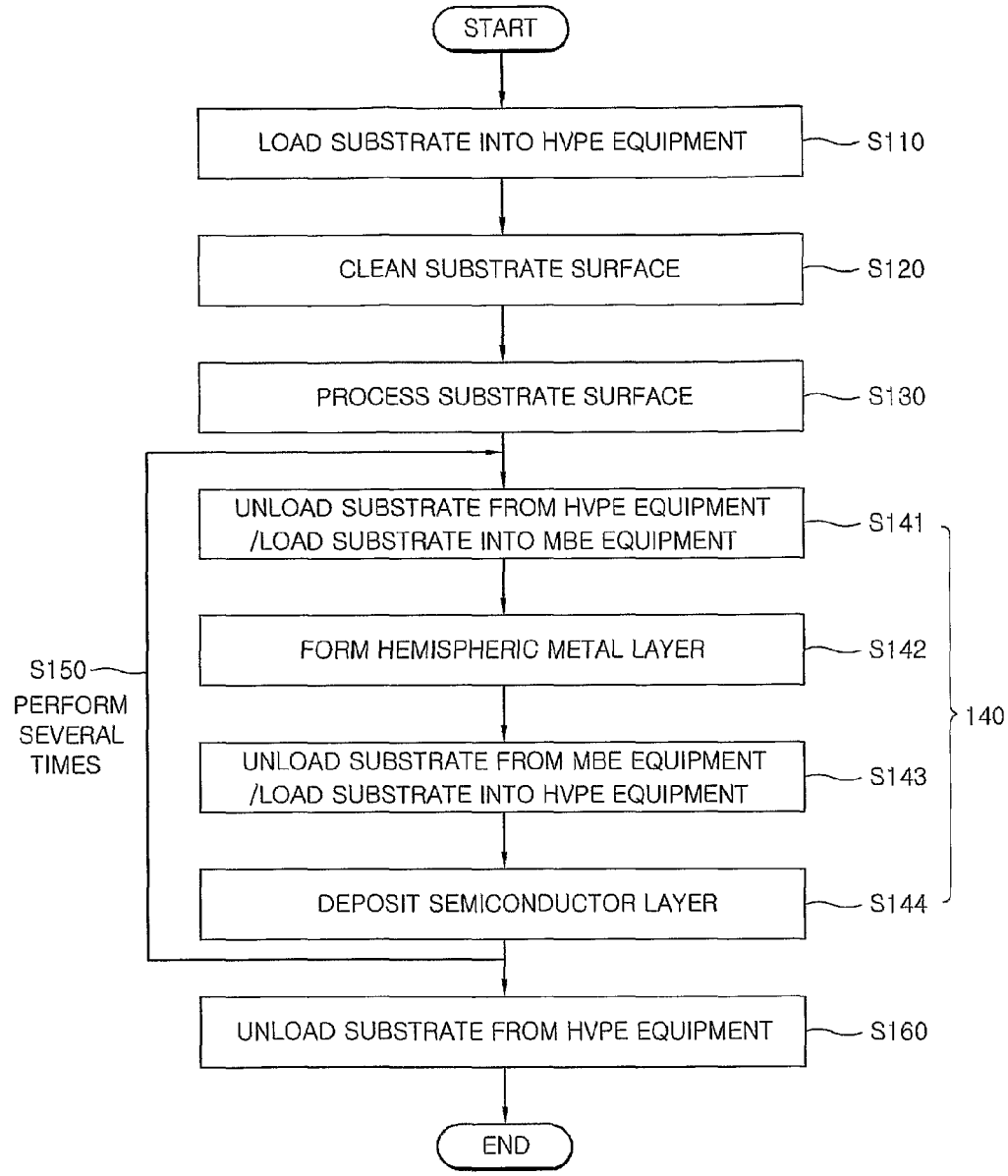
FIG. 2 is a process flowchart illustrating a method for manufacturing a semi-conductor substrate in accordance with one exemplary embodiment.
Figure 3:
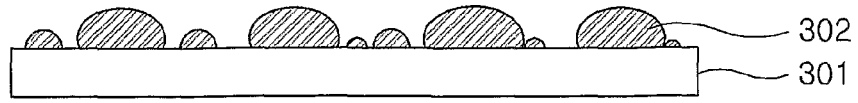
FIGS. 3 through 5 are cross-sectional views illustrating manufacturing processes of a semiconductor substrate in accordance with one exemplary embodiment.
Figure 4:
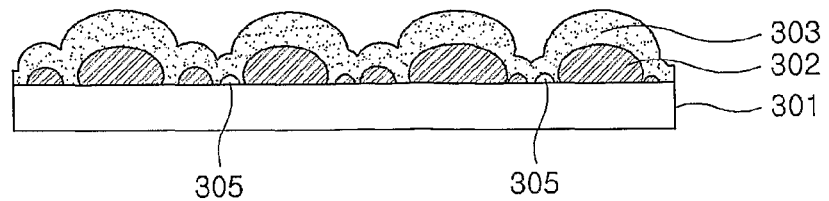
Figure 5:
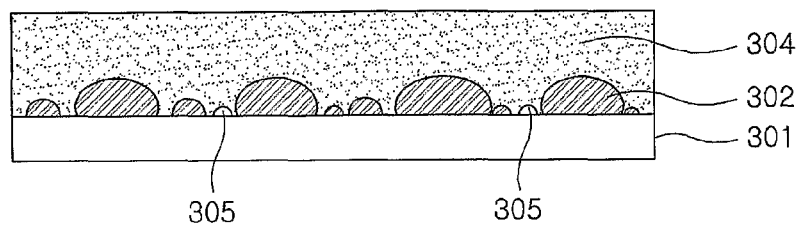

FIG. 2 is a process flowchart illustrating a method for manufacturing a semiconductor substrate in accordance with one exemplary embodiment. FIGS. 3 through 5 are cross-sectional views illustrating manufacturing processes of a semiconductor substrate in accordance with one exemplary embodiment.

In operation S110 for loading a substrate, a prepared chamber is purged using N2 gas, a substrate is loaded into the chamber and mounted on a substrate holder in the chamber. The substrate holder may be any means that can stably fix the substrate at a deposition position. For example, the substrate holder may be a holder type that holds a substrate surface vertically or a stage type that holds the substrate surface horizontally. Additionally, the substrate may be a Silicon On Insulation (SOI) substrate having a single crystal semiconductor layer or be a single crystal semiconductor wafer. The single crystal semiconductor layer may be one of a single crystal silicon layer, a single crystal sapphire layer, a single crystal germanium layer, a single crystal silicon germanium layer, and a single crystal silicon carbide layer. The single crystal semiconductor wafer may be one of a single crystal silicon wafer, a single crystal sapphire wafer, a single crystal germanium wafer, a single crystal silicon germanium wafer, and a single crystal silicon carbide wafer. In this embodiment, the single crystal sapphire wafer (hereinafter, referred to as a sapphire substrate) will be used exemplarily.

In operation S120 for cleaning the substrate surface, impurities remaining on the substrate surface are removed by using a cleaning gas, for example. In this embodiment, the surface cleaning is performed for about 5 min to about 30 min by using a mixture gas of HCl and N2 having a mixing ratio of about 1:5 to 1:10.

In operation S130 for treating the substrate surface, nitrogen (N)-containing gas and/or oxygen-containing gas is/are supplied to form at least one thin layer of a nitride layer, an oxide layer, and oxy-nitride layer. In a case of the sapphire substrate, when an N-containing reaction such as N2, NH3, and NH3/N2 is supplied, a nitride layer is formed, and when an N and O-containing reaction gas such as a mixture gas of NH3 and O2 is supplied, an oxy-nitride layer is formed. Additionally, when an N, O and Si-containing reaction gas such as a mixture gas of N2O and Si is supplied, a silicon oxy-nitride layer is formed.

Operations S120 for cleaning the surface and S130 for treating the surface may be simultaneously performed and any one of them can be omitted. Additionally, operations S120 and S130 may be performed using a Hydride Vapor Phase Epitaxy (HVPE) process.

The HVPE process provides source-reaction gas and carrier gas to a container, which is connected to the inside of the chamber and in which source material is supplied (for example, a supply tube in which a metal source material is supplied), to allow the source gas dissolved from the source material and the reaction gas is individually supplied through individual gas line to be applied to the heated substrate surface in the chamber. As a result, the vapor reaction with the source gas and reaction gas occurs, so that the product of the vapor reaction is deposited on the heated substrate surface in the chamber to grow a desired thin layer on the substrate. At this point, the source-reaction gas may be HCl gas and the reaction gas may be NH3. The carrier gas may be an inert gas such as N2 and Ar.

Operation S140 for forming a semiconductor layer with a discontinuous hemispheric metal layer includes operation S142 for forming a discontinuous hemispheric metal layer using Group III metal by the supplying of the source gas without the supplying of the reaction gas on the surface treated substrate and operation S144 for forming a nitride semiconductor layer in a single layer or a multi layer structure on the hemispheric metal layer by the supplying of both the source gas and the reaction gas.

First, as illustrated in FIG. 3, Ga metal is deposited on the surface treated substrate 301 at a temperature of higher than a melting point of the Ga metal or lower than 450° C. through various methods such as sputtering, Molecular Beam Epitaxy (MBE), E-Beam evaporator, Metal Organic Chemical Vapor Deposition (MOCVD), and HVPE. At this point, the Ga metal does not expand in a horizontal direction of the substrate 301 because of surface tension, and is formed discontinuously with a big and small hemispheric shape, such that the Ga metal serves as a seed that helps the growth of a nitride semiconductor layer that will be formed later. Especially, the hemispheric metal layer 302 may be formed with the size of about 0.1 μm to 5 μm over an entire area of the substrate 301. Of course, the hemispheric metal layer 302 is not limited to the Ga metal, and may be formed of Group III metal, for example, In metal.

Next, as illustrated in FIG. 4, when a nitride semiconductor layer 303 is deposited on an entire structure including the hemispheric metal layer 302, the nitride semiconductor layer 303 grows vertically and horizontally from the surface of the hemispheric metal layer 302. Accordingly, a void 305 is formed between the hemispheric metal layer 302, and a space between the hemispheric metal layers 302 becomes smaller. Also, when the nitride semiconductor layer 303 is deposited with a sufficient thickness as shown in FIG. 5, the space between the hemispheric metal layers 302 is filled and thus the top surface of the nitride semiconductor layer 303 is planarized appropriate for the growth of subsequent layers for the device. At this point, the nitride semiconductor layer 303 may be formed with a thickness of about 5 μm to 100 μm through various methods such as MBE, MOCVD, and HVPE. Of course, according to this embodiment, the hemispheric metal layer 302 and the nitride semiconductor layer 303 are separately formed, but can be formed almost simultaneously. Additionally, the nitride semiconductor layer 303 may be formed in a multi layer not a single layer.

On the other hand, operation S142 for forming the hemispheric metal layer may be performed through manufacturing equipment different from those of operations S130 and S144. That is, after the preceding operation S130 for treating the substrate surface is completed, the substrate may be unloaded from HVPE equipment and then loaded into MBE equipment to form a hemispheric metal layer on the substrate. Next, the substrate may be unloaded from the MBE equipment again, and then loaded into the HVPE equipment to perform the following operation S144 for forming a nitride semiconductor layer.

Additionally, in operation S140 for forming the semiconductor layer with the discontinuous hemispheric metal layer, operation S142 or S144 may be repeatedly performed at least once, and all operations S142 and S144 may be repeatedly performed at least once. Additionally, in operation S140, at least one of operation S120 for cleaning the surface and operation S130 for treating the surface may be selectively performed. For example, operation S120 for cleaning the surface may be previously performed before operation S142 or S144, and then operation S130 for treating the surface may be performed. Or, if necessary for manufacturing processes, operation S120 for cleaning the surface or operation S130 for treating the surface may be performed independently.

In operation S160 for unloading the substrate, after operations S110 to S130 are completed, purging is performed using N2 gas. While the purging is continuously performed using the N2 gas, temperature is slowly decreased until the internal temperature of the chamber reaches the room temperature. Through this, thermal impact on the substrate can be minimized. Next, the substrate is dismounted from the substrate holder and the dismounted substrate is drawn into the external of the chamber. At this point, the drawn substrate may be placed for the next process for forming a device layer of an electronic device such as a power device, a light emitting device, and a light receiving device on the substrate.

Through the above manufacturing processes, a semiconductor layer including a discontinuous hemispheric metal layer with the thickness of approximately 15 μm on the substrate is formed. Therefore, a semiconductor substrate with less bow or warpage can be manufactured, and its characteristics will be described below.

Figure 6:
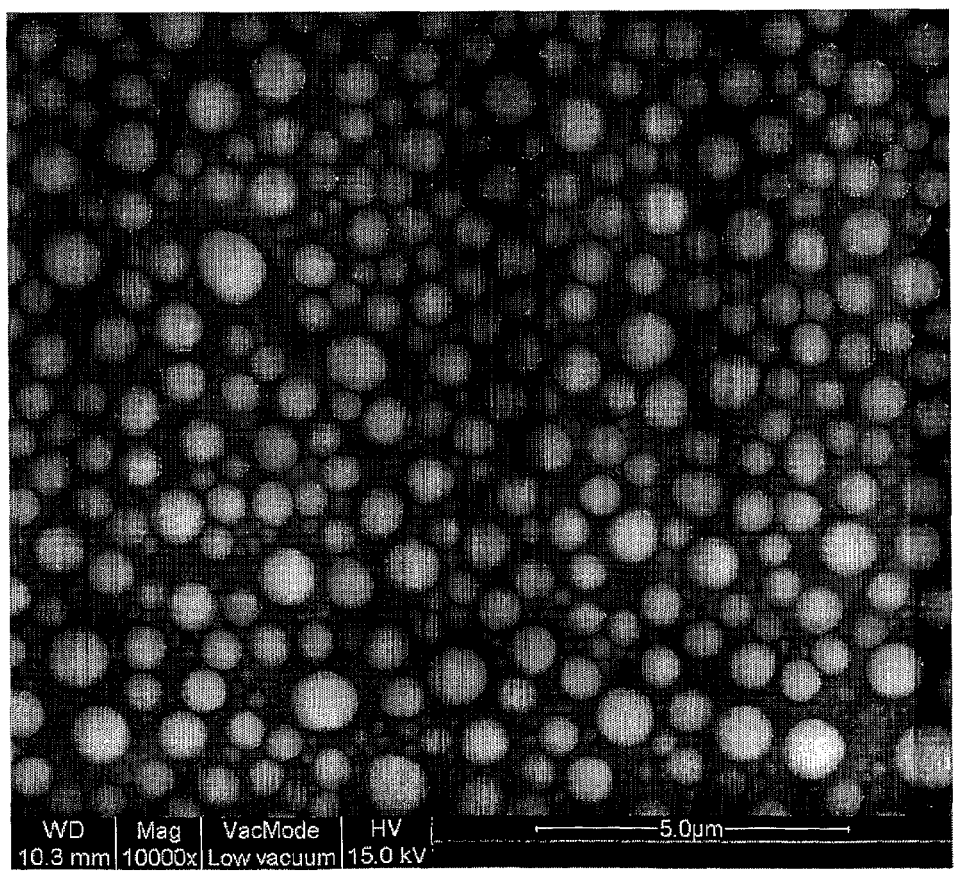
FIGS. 6 and 7 are SEM photographs showing a plane view and a cross-sectional view of a hemispheric metal layer in accordance with one exemplary embodiment.
Figure 7:
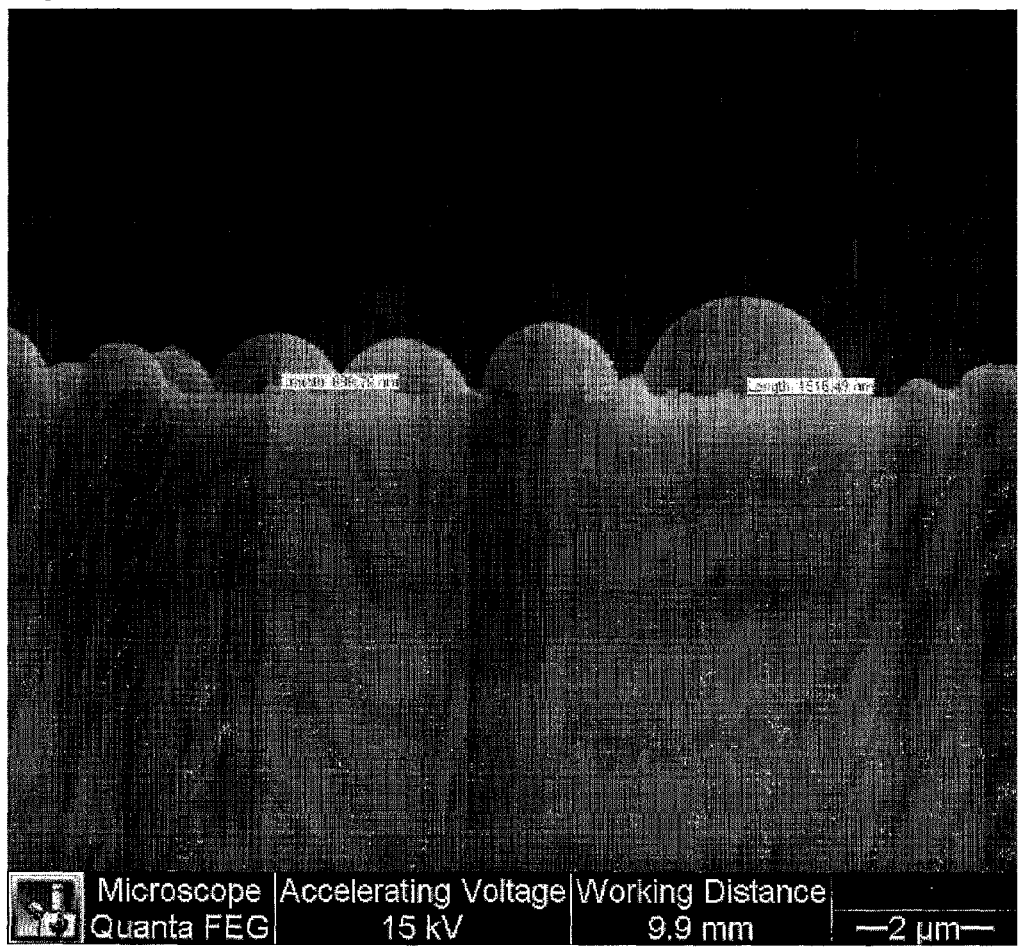

FIGS. 6 and 7 are Scanning Electron Microscope (SEM) photographs showing a plane view and a cross-sectional view of a hemispheric metal layer in accordance with one exemplary embodiment. The hemispheric metal layer is formed using Ga metal through a MBE method under a temperature condition of 200° C. Referring to FIGS. 6 and 7, it is confirmed that the hemispheric metal layer has a size of approximately 0.1 μm to 2 μm. Additionally, it is confirmed that the hemispheric metal layer has a three-dimensional structure.

Because the hemispheric metal layer has a three-dimensional structure, a nitride semiconductor layer formed on the hemispheric metal layer has a three-dimensional structure also. Due to this, a plurality of voids is formed in the nitride semiconductor layer, thereby relaxing the stain of interface between the nitride semiconductor layer and the substrate. Additionally, since the hemispheric metal layer supplies Ga metal to the nitride semiconductor layer during the forming of the nitride semiconductor layer, a vertical concentration gradient of the Ga metal is formed in the nitride semiconductor layer according to the height. The vertical concentration gradient of the Ga metal serves to relax the strain of interface between the substrate and the nitride semiconductor layer, and also the Ga metal remaining on the substrate serves to relax the strain of interface between the substrate and the nitride semiconductor layer. As a result, a semiconductor substrate having relatively less bow or warpage can be manufactured.

Figure 8:
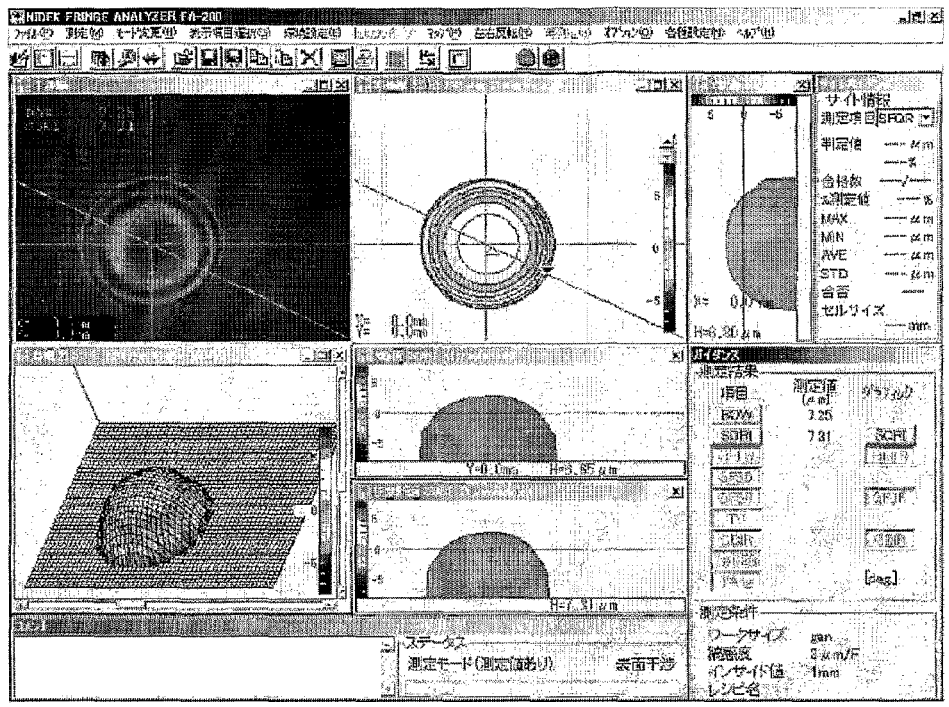
FIG. 8 is a graph illustrating bow or warpage characteristic of a semiconductor substrate in accordance with a first experimental example.
Figure 9:
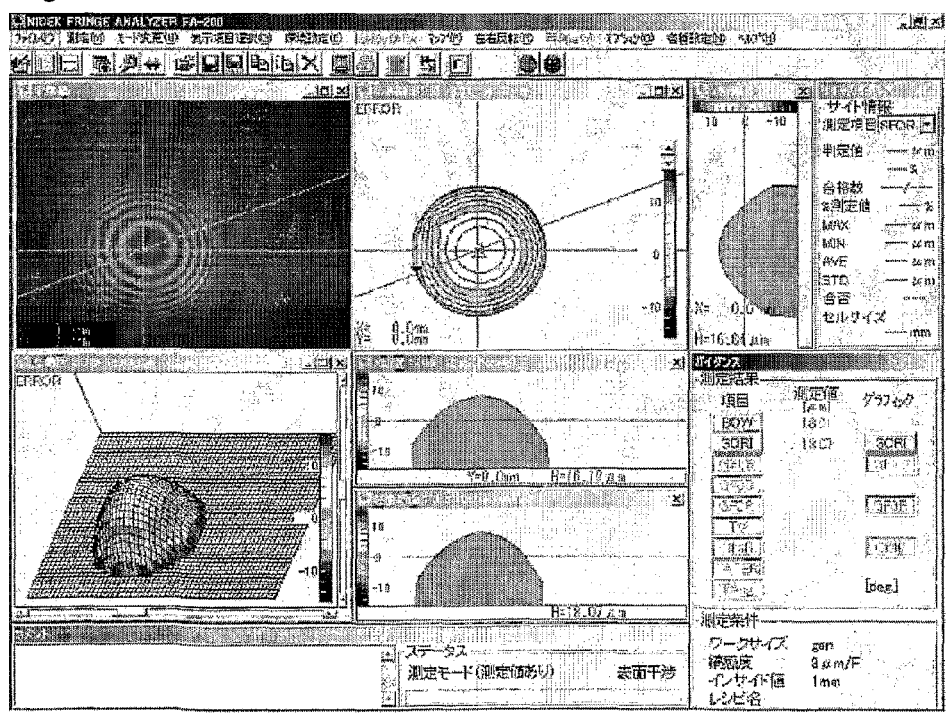
FIG. 9 is a graph illustrating bow or warpage characteristic in accordance with a first comparative example.

FIG. 8 is a graph illustrating bow or warpage characteristic of a semiconductor substrate in accordance with a first experimental example. FIG. 9 is a graph illustrating bow or warpage characteristic in accordance with a first comparative example.

First, in the semiconductor substrate in accordance with the first experimental example, a hemispheric metal layer of Ga metal is formed on a sapphire substrate, with a size of approximately 0.1 μm to 2 μm through an MEB method, and a nitride semiconductor layer is formed with a thickness of 3 μm through an HVPE method. In this case, as shown in FIG. 8, bow or warpage of 7.25 μm occurs under the conditions where the sapphire substrate has the thickness of 430 μm and its size is 1 inch. If this is converted into the substrate conditions where the sapphire substrate has the thickness of 430 μm and its size is 2 inches, bow or warpage is calculated between 28 μm and 30 μm. In the semiconductor substrate in accordance with the first comparative example, a nitride semiconductor layer having the thickness of 2 μm is formed on the sapphire substrate under the same condition except for the hemispheric metal layer. In this case, as illustrated in FIG. 9, bow or warpage of 18.01 μm occurs under the conditions where the sapphire substrate has the thickness of 430 μm and its size is 1 inch. If this is converted into the substrate conditions where the sapphire substrate has the thickness of 430 μm and its size is 2 inches, bow or warpage is calculated between 72 μm to 75 μm. It is confirmed that through the comparison, the semiconductor substrate of the embodiment has less bow or warpage. As mentioned above, a plurality of voids in the nitride semiconductor layer including the discontinuous hemispheric metal layer, a concentration gradient of the Ga metal, and the remaining Ga metal alleviate interface stress between the substrate and the nitride semiconductor layer.

Figure 10:
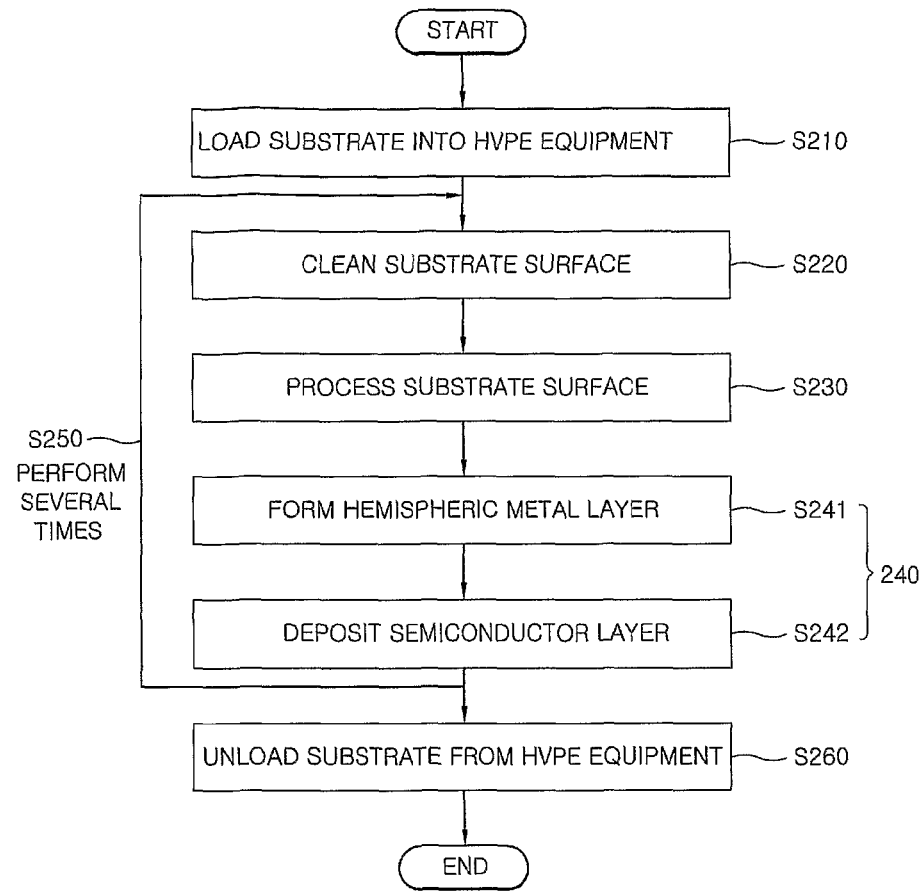
FIG. 10 is a process flowchart illustrating a method for manufacturing a semiconductor substrate in accordance with a first modification.

FIG. 10 is a process flowchart illustrating a method for manufacturing a semiconductor substrate in accordance with a first modification.

Referring to FIG. 10, all processes (including operation S210 for cleaning the substrate surface, operation S220 for treating the substrate surface, operation S241 for forming a discontinuous hemispheric metal layer, and operation S242 for forming a nitride semiconductor layer) may be performed in the single process equipment. For example, if HVPE equipment (in which one or a plurality of gas lines is/are connected to one chamber such that it is possible to supply various gases) is used, operation S210 for cleaning the substrate surface, operation S220 for treating the substrate surface, operation S241 for forming a discontinuous hemispheric metal layer, and operation S242 for forming a nitride semiconductor layer can be performed continuously. Accordingly, manufacturing time increase and substrate contamination do not occur while the substrate transfers to a plurality of chambers.

Embodiment 2

Figure 11:
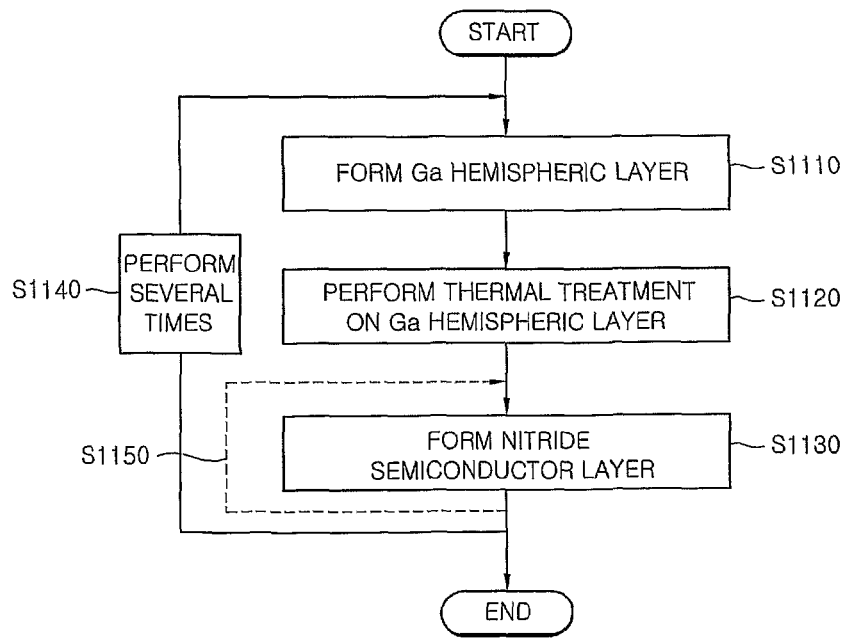
FIG. 11 is a process flowchart illustrating a method for manufacturing a semiconductor substrate in accordance with another exemplary embodiment.

FIG. 11 is a process flowchart illustrating a method for manufacturing a semiconductor substrate in accordance with another exemplary embodiment. FIGS. 12 through 15 are cross-sectional views illustrating manufacturing processes of a semiconductor substrate in accordance with another exemplary embodiment.

Referring to FIG. 11, the method for manufacturing a semiconductor substrate includes operation S1110 for forming a discontinuous hemispheric layer on a substrate, operation S1120 for performing a thermal treatment process on the substrate and the hemispheric layer, and operation S1130 for forming a nitride semiconductor layer on the thermally-treated hemispheric layer.

Figure 12:
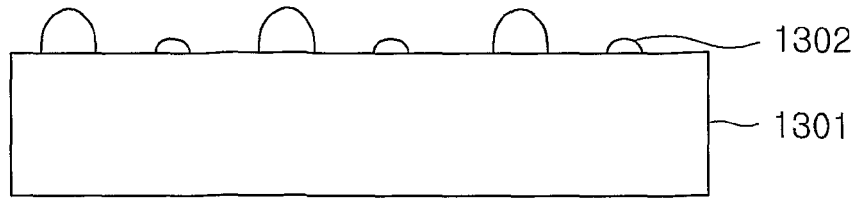
FIGS. 12 through 15 are cross-sectional views illustrating manufacturing processes of a semiconductor substrate in accordance with another exemplary embodiment.

First, as illustrated in FIG. 12, in operation S1110 for forming the hemispheric layer, a discontinuous hemispheric layer 1302 is formed on a predetermined substrate 1301. At this point, the substrate 1301 includes at least Al element. For example, this embodiment uses the sapphire substrate 1301 having a chemical formula of Al2O3. Additionally, the hemispheric layer 1302 may be formed of at least one metal selected from Group III elements such as Ga, Al, and In. For example, this embodiment uses Ga metal. During the forming of the hemispheric layer 1302, the Ga metal is deposited on the sapphire substrate 1301 at a temperature of higher than a melting point of the Ga metal or lower than 450° C. through various methods such as sputtering, MBE, E-Beam evaporator, MOCVD, CVD and HYPE. At this point, if a small amount of the Ga metal 1302 is deposited, the Ga metal 1302 does not spread in a horizontal direction of the substrate 1301 because of surface tension, and has large and small hemispheric forms discontinuously. That is, hemispheres having a size of approximately 0.1 μm to 5 μm are discontinuously formed on the sapphire substrate 1301 to form a Ga hemispheric layer 1302.

Figure 13:
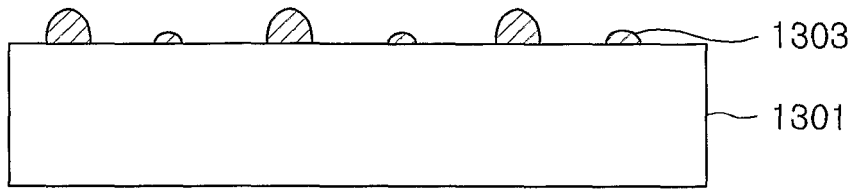

Next, as illustrated in FIG. 13, a thermal treatment process is performed on the sapphire substrate 1301 having the Ga hemispheric layer thereon in operation S1120. Accordingly, Al element of the sapphire substrate 1301 is diffused into the hemispheric layer 1302 such that the initial Ga hemispheric layer 1302 is changes into an AlxGa1-x hemispheric layer containing Al element. This AlxGa1-x hemispheric layer 1303 may function as a seed that facilitate the growth of a nitride semiconductor layer that will be formed later. At this point, the AlxGa1-x hemispheric layer 1303 includes a plurality of discontinuously formed hemispheres, and each hemisphere may be formed with a preferable size of approximately 0.1 μm to 5 μm over entire areas of the substrate 1301. Operation S1120 for performing the thermal treatment may be performed for approximately 1 min to 60 min at a temperature between approximately 700° C. to 1100° C. through equipment that will be used in operation S1130 for forming the a nitride semiconductor layer (that is, the next operation)

Figure 14:
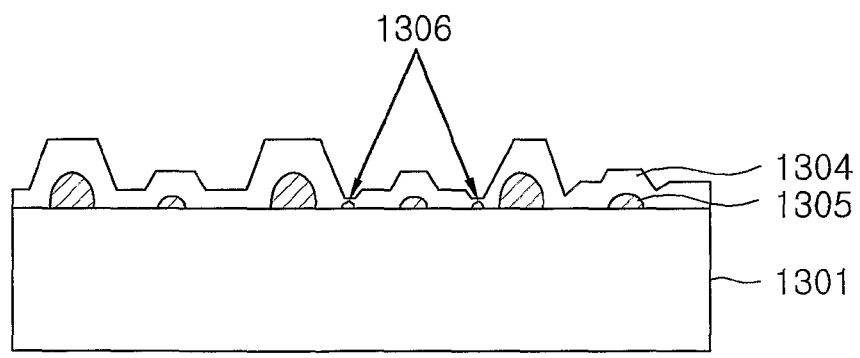
Figure 15:
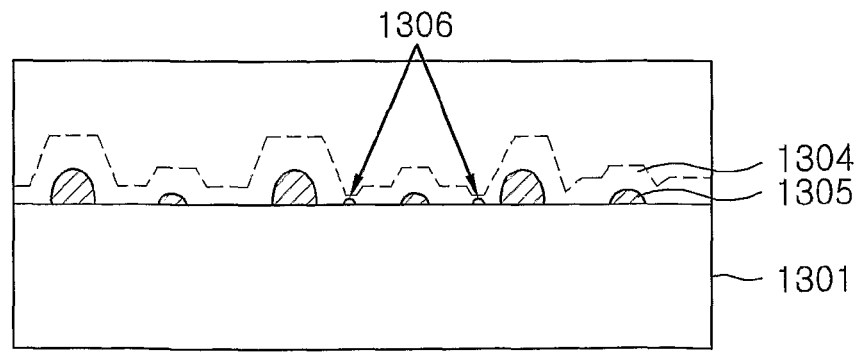

Next, as illustrated in FIG. 14, a nitride semiconductor layer 1304 is deposited on the entire structure including the AlxGa1-x hemispheric layer 1303 to planarize the surface of the AlxGa1-x hemispheric layer 1303 in operation S1130. Accordingly, the AlxGa1-x hemispheric layer 1303 is nitrided into an AlxGa1-xN hemispheric layer 1305 and thus, voids 1306 are formed therein. Therefore, space between the AlxGa1-xN hemispheric layer 1305 becomes gradually narrower. As illustrated in FIG. 15, if the nitride semiconductor layer 1304 is deposited sufficiently thickly, space between the AlxGa1-xN hemispheric layer 1305 is filled and thus the top surface of the nitride semiconductor layer 1304 is planarized appropriate for the growth of subsequent layers for the device. At this point, the nitride semiconductor layer 1304 may be formed with a thickness of approximately 5 μm to 100 μm through various methods such as MBE, MOCVD, and HYPE.

Next, as illustrated in FIG. 11, the AlxGa1-x hemispheric layer 1303 and the nitride semiconductor layer 1304 are repeatedly formed in operation S1140 to form a predetermined thickness on the substrate 1301. Of course, if necessary, the AlxGa1-x hemispheric layer 1303 and the nitride semiconductor layer 1304 may not be repeatedly formed and any one of the AlxGa1-x hemispheric layer 1303 and the nitride semiconductor layer 1304 can be selectively repeatedly formed. For example, an AlxGa1-xN hemispheric layer (which is nitrided from the AlxGa1-x hemispheric layer)/a first nitride semiconductor layer/a second nitride semiconductor layer are formed on the substrate 1301 in order to form only the nitride semiconductor layer having a multi-layer structure in operation S1150.

The semiconductor substrate manufactured through the above manufacturing processes can be used as a substrate for forming a device layer thereon, which is an electronic device such as a power device, a light emitting device, and a light receiving device. For this, an additionally subsequent process can be performed. Especially, a nitride semiconductor layer including a discontinuous AlxGa1-xN hemispheric layer 1305 is formed with the thickness of approximately 5 μm to 15 μm on the semiconductor substrate manufactured through the above processes. This nitride semiconductor layer absorbs or relaxes the strain of interface between the nitride semiconductor layer and a device layer that will be formed later. That is, during the forming of the next layer, bow or warpage occurs less such that the subsequent process can be performed without difficulties. Below, characteristics of the hemispheric layer 1303 or 1305 formed on the semiconductor substrate and its bow or warpage characteristics will be described in more detail below.

Figure 16:
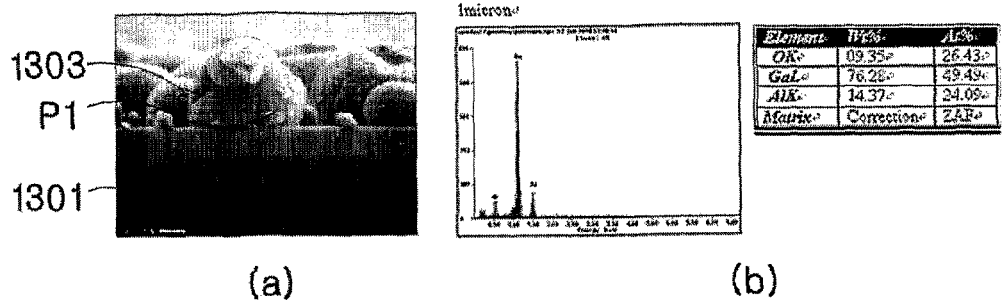
FIGS. 16 through 18 are SEM photographs and EDS analysis graphs of an AlxGa1-x hemispheric layer formed through a thermal treatment process in accordance with another embodiment.
Figure 17:
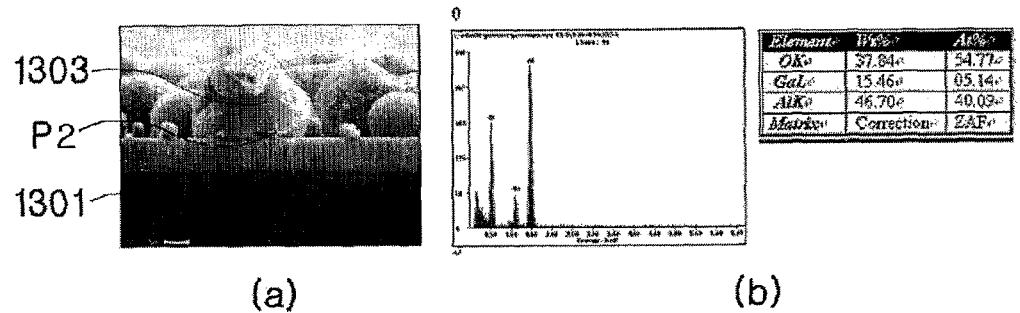
Figure 18:
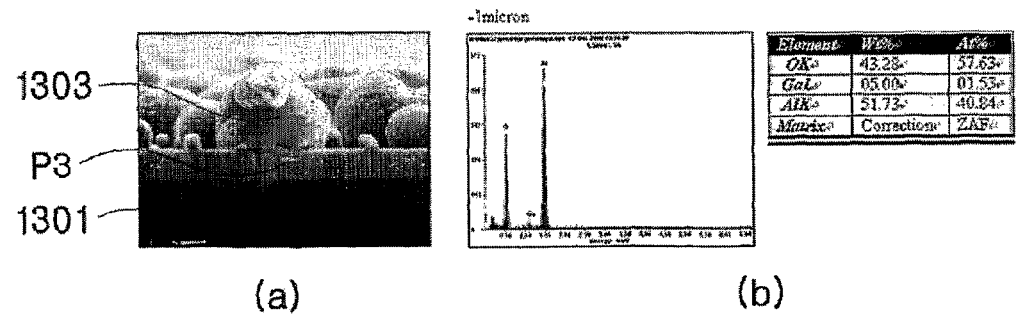
Figure 19:
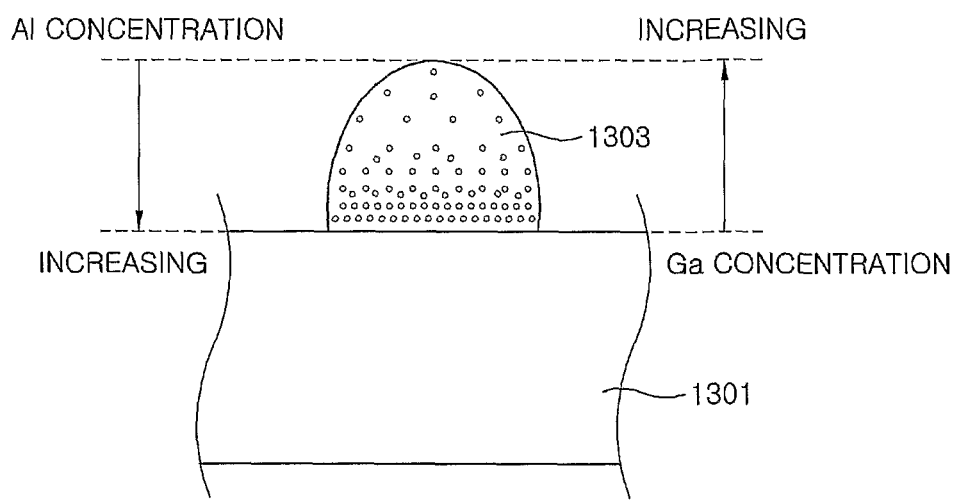
FIG. 19 is a cross-sectional view illustrating a concentration gradient of an AlxGa1-x hemispheric layer formed through a thermal treatment process in accordance with another embodiment.

FIGS. 16 through 18 are a SEM cross-sectional picture ((a) of each figure) and an Energy Dispersive X-ray Spectroscopy (EDS) analysis graph ((b) of each figure) of an $Al_xGa_{1-x}$ hemispheric layer formed through a thermal treatment process in accordance with another embodiment. Additionally, FIG. 19 is a cross-sectional view illustrating a concentration gradient of an $Al_xGa_{1-x}$ hemispheric layer formed through a thermal treatment process in accordance with another embodiment. Here, P1, P2, and P3 of the SEM cross-sectional picture represent points where EDS analysis is performed.

Referring to FIGS. 16 and 17, Al element is distributed in the inside P1 and P2 of the $Al_xGa_{1-x}$ hemispheric layer 1303, and Al element content is increased as it approaches the surface of the sapphire substrate 1301 (P1→P2). Additionally, Ga element is not distributed in the inside P3 of the sapphire substrate 1301. Ga element is penetrated near the interface of the Ga hemispheric layer and the sapphire substrate. Referring to FIG. 19 where the experimental results are summarized, concentration of Al element in the $Al_xGa_{1-x}$ hemisphere layer 1303 is increased as it approaches the interface of the sapphire substrate 1301, and concentration of Ga element is increased as it goes far from the surface of the sapphire substrate 1301.

During the result of the thermal treatment process, Al element of the sapphire substrate 1301 diffuses into the hemispheric layer 1303, but Ga element of the hemispheric layer 1303 does not diffuse into the inside of the sapphire substrate 1301 and penetrate restrictively through the surface of the sapphire substrate. Like this, a discontinuous Ga hemispheric layer, which is formed first on the substrate 1301, is thermally heated to form the discontinuous $Al_xGa_{1-x}$ hemispheric layer 1303 having Al element of which concentration gradient is decreased as it goes far from the surface of the substrate 1301.

Figure 20:
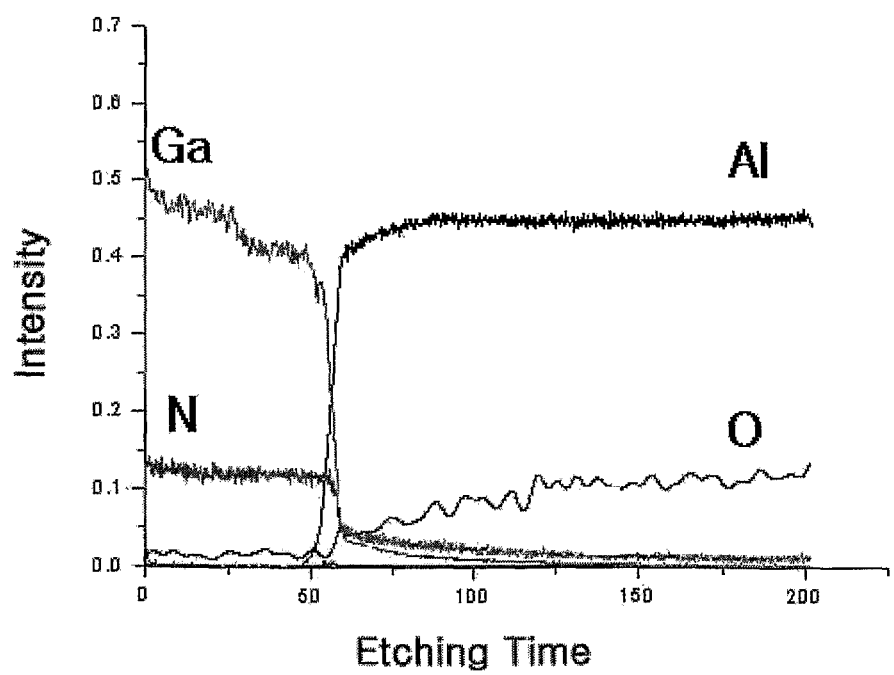
FIGS. 20 and 21 are GDS analysis graphs of an AlxGa1-xN hemispheric layer in accordance with a second comparative example and second experimental example.
Figure 21:
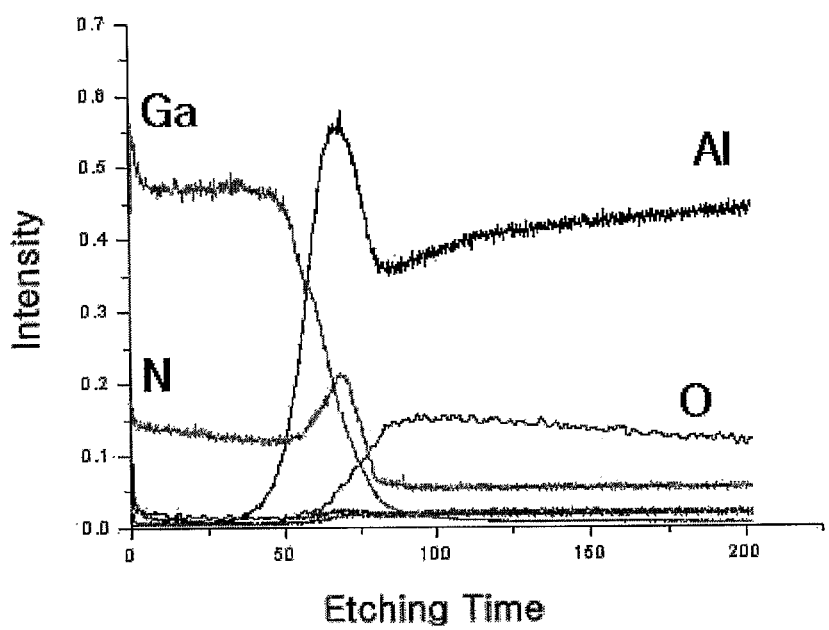

FIGS. 20 and 21 are Glow Discharge Spectrometry (GDS) analysis graphs of an $Al_xGa_{1-x}N$ hemispheric layer in accordance with a second comparative example and second experimental example. In FIG. 20, a GaN layer of 5 μm is formed on a sapphire substrate through MOCVD equipment as a second comparative example. In FIG. 21, a GaN layer of 5 μm is formed on a sapphire substrate through MOCVD equipment as a second experimental example. Compared to FIG. 20 and FIG. 21, Al and N elements are more distributed at the interface between the sapphire substrate and the GaN layer in the second experimental example of FIG. 19. This means that during the forming of the GaN layer, the initial $Al_xGa_{1-x}$ hemispheric layer is changed into $Al_xGa_{1-x}N$ hemispheric layer. That is, during the forming of the GaN layer, the initial $Al_xGa_{1-x}$ hemispheric layer is changed into the $Al_xGa_{1-x}N$ hemispheric layer. And, this layer alleviates the strain of the interface between the substrate and the GaN layer.

Figure 22:
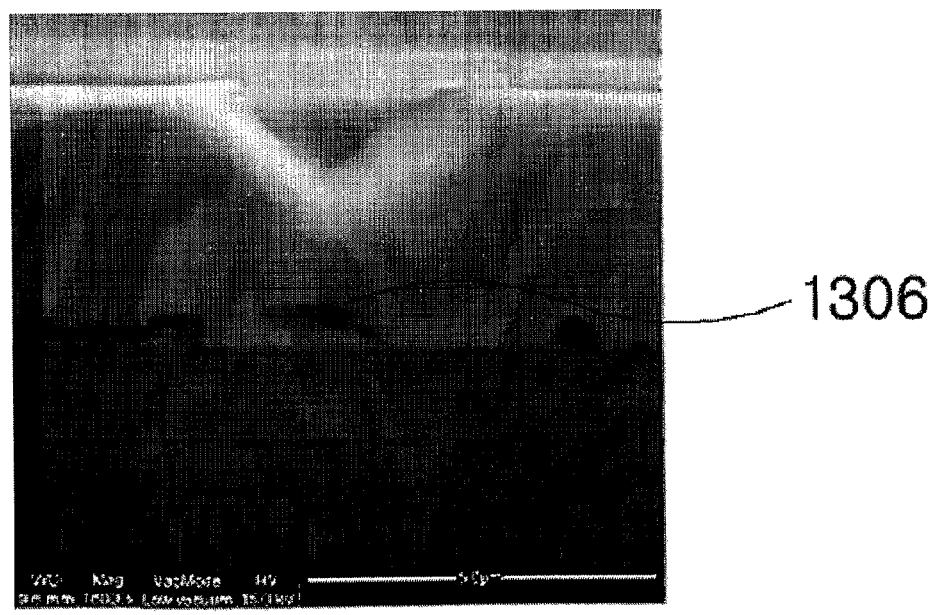
FIGS. 22 and 23 are SEM photographs showing the cross-sectional view of a nitride semiconductor layer according to another exemplary embodiment.
Figure 23:
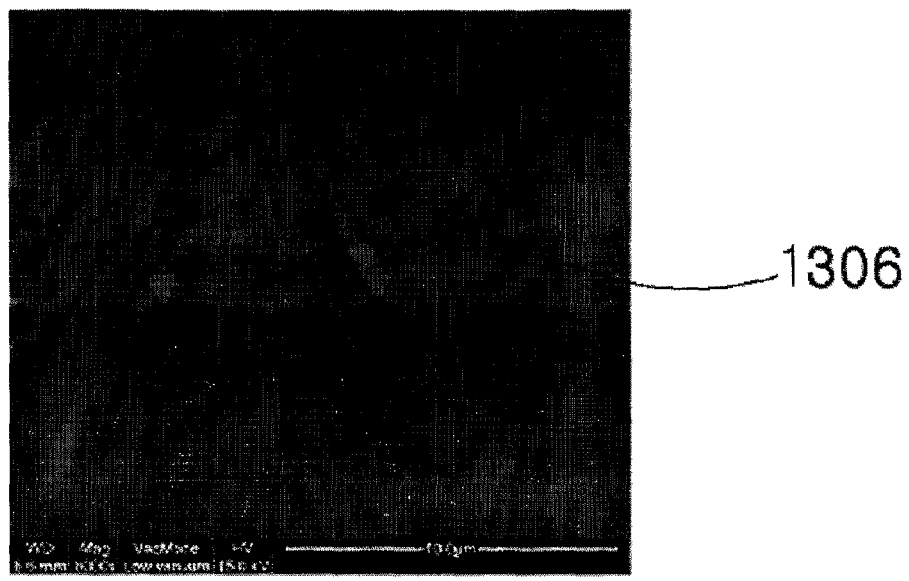

FIGS. 22 and 23 are SEM cross-sectional pictures of a nitride semiconductor layer according to another exemplary embodiment. In FIG. 22, after a thermal treatment process is performed for 5 min at a temperature of 900° C. through a MOCVD method, a GaN layer is formed with the thickness of 3 μm through a MOCVD method. In FIG. 23, after a thermal treatment process is performed for 5 min at a temperature of 1050° C. through a HVPE method, a GaN layer is formed with the thickness of 20 μm through a HVPE method. At this point, a thin layer growth of the GaN layer is controlled by a three-dimensional structure of a discontinuous $Al_xGa_{1-x}$ hemispheric layer disposed below the GaN layer, thereby providing three-dimensional thin layer characteristics. Due to this, a plurality of voids is formed in the GaN layer, and also can relax the strain of interface between a device layer (which will be formed later) and the substrate. Additionally, as mentioned above, the initial $Al_xGa_{1-x}$ hemispheric layer is changed into the $Al_xGa_{1-x}N$ hemispheric layer during the forming of the GaN layer, thereby alleviate the interface stress between the substrate and the GaN layer. As a result, a semiconductor substrate, where bow or warpage occurs relatively less, can be manufactured.

On the other hand, in order to understand bow or warpage characteristics of the semiconductor substrate, bow or warpage characteristics between the third experimental example according to the present invention and the third comparative example according to a typical technique will be compared as follows.

First, in the semiconductor substrate of the third experimental example, a discontinuous Ga hemispheric layer is formed on a sapphire substrate, with a size of 0.1 μm to y 5 μm through an E-beam evaporator method. Then, a thermal treatment process is performed through MOCVD equipment to form a discontinuous $Al_xGa_{1-x}$ hemispheric layer. Additionally, a nitride semiconductor layer is formed with the thickness of 3 μm through the MOCVD equipment. In this case, bow or warpage of 17.81 μm is measured under the conditions where the sapphire substrate has the thickness of 430 μm and the size of 2 inches. In the semiconductor substrate of the third comparative example according to the typical technique, a nitride semiconductor layer is formed with a thickness of 3 μm on the sapphire substrate under the same condition except for the discontinuous $Al_xGa_{1-x}$ hemispheric layer. In this case, bow or warpage of 32.02 μm is measured under the conditions where the sapphire substrate has the thickness of 430 μm and the size of 2 inches. Through the above comparison experiments, it is confirmed that the semiconductor substrate has relatively less bow or warpage characteristics. As mentioned above, that is because that a plurality of voids formed in the nitride semiconductor layer with the discontinuous $Al_xGa_{1-x}$ hemispheric layer, and also the $Al_xGa_{1-x}N$ hemispheric layer changed from the initial $Al_xGa_{1-x}$ hemispheric layer during the forming of the nitride semiconductor layer can relax the strain of interface between the substrate and the nitride semiconductor layer.

Embodiment 3

Figure 24:
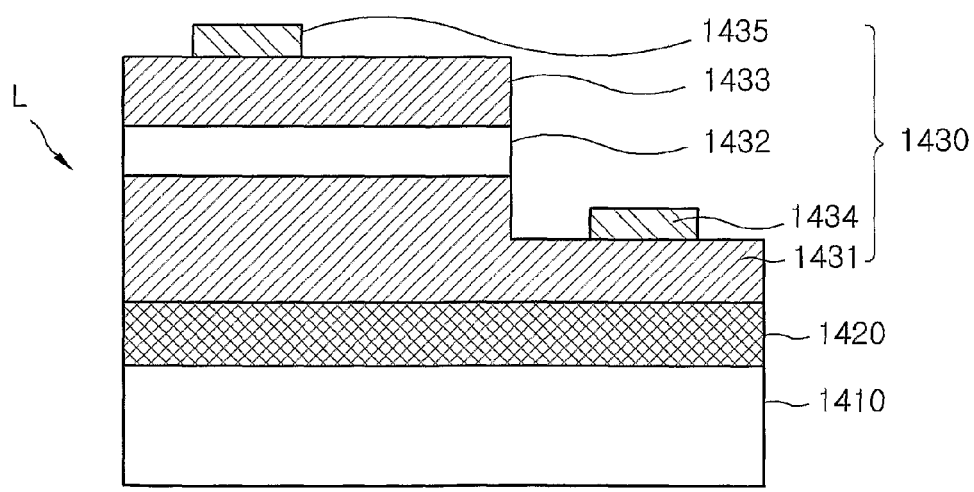
FIG. 24 is a cross-sectional view illustrating a semiconductor device including a semiconductor substrate in accordance with a further another exemplary embodiment.

FIG. 24 is a cross-sectional view illustrating a semiconductor device including a semiconductor substrate in accordance with a further another exemplary embodiment.

Referring to FIG. 24, the semiconductor device includes a substrate 1410, a nitride semiconductor layer 1420 including a discontinuous hemisphere layer on the substrate 1410, and the electronic device layer 1430 on the nitride semiconductor layer 1420. This semiconductor device includes at least one light emitting device L that converts electric energy into light energy, thereby it can be used in a light source module.

As mentioned above, the substrate 1410 may uses a SOI substrate including a single crystal semiconductor layer or a single crystal semiconductor wafer. For example, this embodiment uses a sapphire substrate.

After a discontinuous hemispheric metal layer or discontinuous $Al_xGa_{1-x}N$ is formed on the substrate 1410, the nitride semiconductor layer 1420 is formed by planarizing the surface.

At this point, Group III metal is used to form a discontinuous hemispheric metal layer with a size of approximately 0.1

μm to 5 μm, on the surface treated substrate 1410, and a nitride semiconductor layer of a single layer or a multi layer is formed with the thickness of 5 μm on an entire structure including the discontinuous hemispheric metal layer, in order to form the nitride semiconductor layer 1420 including the discontinuous hemispheric metal layer. As mentioned above, a plurality of voids is formed in the nitride semiconductor layer 1420 including the discontinuous hemispheric metal layer. Moreover, a concentration gradient of the Ga metal in the hemispheric metal layer and the remaining Ga metal relax the strain of interface between the substrate 1410 and the nitride semiconductor layer, such that bow or warpage of the substrate 1410 occurs less.

In the nitride semiconductor layer 1420 including the discontinuous AlxGa1-xN hemispheric layer, a discontinuous Ga hemispheric layer is formed with a size of approximately 0.1 μm to 5 μm, on the substrate 1410. Then, through the thermal treatment process, the discontinuous AlxGa1-x hemispheric layer is formed with a size of approximately 0.1 μm to 5 μm. A nitride semiconductor layer of a single layer or a multi layer is formed on an entire structure including the discontinuous AlxGa1-x hemispheric layer. At this point, the AlxGa1-x hemispheric layer is nitrided into an AlxGa1-xN hemispheric layer. A plurality of voids is formed in the nitride semiconductor layer 1420 including the discontinuous AlxGa1-xN hemispheric layer. Additionally, the discontinuous AlxGa1-xN hemispheric layer relax the strain of interface between the substrate 1410 and a nitride semiconductor layer (which will be formed later), such that bow or warpage of the substrate 1410 occurs less.

At least one light emitting device L is provided in the electronic device layer 1430. The light emitting device L includes a semiconductor layer. The semiconductor layer includes an n-type layer 1431, an active layer 1432, and a p-type layer 1433, a first electrode 1434 that is formed on a top portion of the n-type layer 1431, and a second electrode 1435 that is formed on a top portion of the p-type layer 1433, which are stacked on the nitride semiconductor layer 1420 including a discontinuous semi metal layer of the substrate 1410.

The n-type layer 1431, the active layer 1432, and the p-type layer 1433 may be formed of a semiconductor thin layer including at least one of Si, GaN, AN, InGaN, AlGaN, and AlInGaN. For example, in this embodiment, the n-type layer 1431 and the p-type layer 1433 are formed of a GaN thin layer, and the active layer 1432 is formed of an InGaN thin layer. The n-type layer 1431 provides electrons and may be formed by implanting an n-type dopant such as Si, Ge, Se, Te, and C into the above-mentioned semiconductor layer. The p-type layer 1433 provides holes and may be formed by implanting a p-type dopant such as Mg, Zn, Be, Ca, Sr, and Ba into the above-mentioned semiconductor layer. The active layer 1432 is a layer for outputting light of a predetermined wavelength when electrons from the n-type layer 1431 and holes from the p-type layer 1433 are combined. The active layer 1432 may be formed of a multi-layered semiconductor thin layer having a single quantum well structure or a multiple quantum well structure, which is formed by stacking a well layer and a barrier layer alternately. According to a semiconductor material constituting the active layer 1432, a wavelength of an outputted light varies. Therefore, an appropriate semiconductor material needs to be selected according to a targeted output wavelength.

In this semiconductor device, since the nitride semiconductor layer 1420 including a discontinuous hemispheric metal layer or a discontinuous AlxGa1-xN hemispheric layer absorb and relax the strain between the substrate 1410 and the electronic device layer 1430, bow or warpage of the substrate 1410 occurs less during the forming of the electronic device layer 1430 on the substrate 1410. Accordingly, since handling of the substrate such as substrate chucking, substrate alignment may be completed without difficulties during the subsequent processes, typical disadvantages such as decrease about product yield and life time can be prevented.

In the above mentioned semiconductor device, a nitride semiconductor layer including a discontinuous hemispheric metal layer or a discontinuous AlxGa1-xN hemispheric layer is formed on a substrate and a light emitting device L is formed on the substrate. However, the present invention is not limited thereto. That is, various devices (such as a transistor, a photovoltaic cell, a Metal-Oxide Semiconductor Field Effect Transistor (MOSFET), the Schottky diode, and a photo sensor) can be formed on the substrate.

Although the organic light emitting device has been described with reference to the specific embodiments, it is not limited thereto. Therefore, it will be readily understood by those skilled in the art that various modifications and changes can be made thereto without departing from the spirit and scope of the present invention defined by the appended claims.

The invention claimed is:

1. A semiconductor substrate comprising:
   a substrate;
   a hemispheric metal layer formed on the substrate discontinuously; and
   a semiconductor layer formed on the hemispheric metal layer,
   wherein the semiconductor layer has a distribution of a metal element supplied from the hemispheric metal layer, and
   wherein the semiconductor layer has a concentration gradient in which density of the metal element is decreased in a thickness direction.

2. The semiconductor substrate of claim 1, wherein the hemispheric metal layer comprises Group III metal and the semiconductor layer comprises nitride of the Group III metal.

3. The semiconductor substrate of claim 2, wherein the Group III metal comprises at least one of Ga and In.

4. The semiconductor substrate of claim 1, wherein the semiconductor layer comprises a plurality of voids formed at an interface between the substrate and the semiconductor layer.

5. A semiconductor substrate comprising:
   a substrate;
   a hemispheric metal layer formed on the substrate discontinuously; and
   a semiconductor layer formed on the hemispheric metal layer,
   wherein the semiconductor layer has a distribution of a metal element supplied from the hemispheric metal layer, and
   wherein the semiconductor layer has a concentration gradient in which density of the metal element is decreased in a thickness direction of the semiconductor layer; and
   the substrate has a final bow or warpage of less than 70 μm when the substrate has the size of 2 inches and the thickness of 430 μm and a total thickness of the hemispheric metal layer and the semiconductor layer is between 5 μm and 100 μm.

6. The semiconductor substrate of claim 5, wherein the hemispheric metal layer comprises Group III metal and the semiconductor layer comprises nitride of the Group III metal.

7. The semiconductor substrate of claim 6, wherein the Group III metal comprises at least one of gallium (Ga) and indium (In).

8. The semiconductor substrate of claim 5, wherein the semiconductor layer comprises a plurality of voids formed at an interface between the substrate and the semiconductor layer.

9. A semiconductor substrate comprising:
   a substrate comprising at least an aluminum (Al) element;
   a hemispheric layer formed on the substrate discontinuously; and
   a nitride semiconductor layer formed on the hemispheric layer,
   wherein the hemispheric layer has a distribution of the aluminum (Al) element diffused from the substrate during a thermal treatment process,
   wherein the hemispheric layer has a concentration of the aluminum (Al) element that is decreased as it goes far from an interface between the substrate and the hemispheric layer.

10. The semiconductor substrate of claim 9, wherein the hemispheric layer is formed of at least one metal selected from gallium (Ga), aluminum (Al), and indium (In).

11. The semiconductor substrate of claim 9, wherein the hemispheric layer is nitrided by the nitride semiconductor layer and a surface of the nitride semiconductor on the hemispheric layer is planarized by formation of the nitride semiconductor layer.

12. The semiconductor substrate of claim 9, wherein the nitride semiconductor layer comprises a plurality of voids at an interface between the substrate and the nitride semiconductor layer.

13. A semiconductor substrate comprising:
   a substrate:
   a hemispheric layer formed on the substrate discontinuously; and
   a nitride semiconductor layer formed on the hemispheric layer,
   wherein:
   the hemispheric layer has a distribution of a metal element diffused from the substrate during a thermal treatment process; and
   the hemispheric layer has a concentration of the metal element that is decreased as it goes far from an interface between the substrate and the hemispheric layer.

14. The semiconductor substrate of claim 13, wherein the metal element comprises aluminum (Al) element.

15. The semiconductor substrate of claim 13, wherein the nitride semiconductor layer comprises a plurality of voids formed at an interface between the substrate and the nitride semiconductor layer.

16. The semiconductor substrate of claim 13, wherein the hemispheric layer is nitrided by the nitride semiconductor layer and a surface of the nitride semiconductor on the hemispheric layer is planarized by formation of the nitride semiconductor layer.

* * * * *